United States Patent
Jung et al.

(10) Patent No.: US 10,777,285 B2
(45) Date of Patent: Sep. 15, 2020

(54) MEMORY SYSTEM CAPABLE OF PREVENTING READ FAIL, INCLUDING READING A SECOND MEMORY BLOCK THROUGH A DUMMY READ OPERATION, WHEN AN ERASE OPERATION IS PERFORMED TO A FIRST MEMORY BLOCK, AND OPERATING METHOD THEREOF

(71) Applicant: SK hynix Inc., Gyeonggi-do (KR)

(72) Inventors: Won-Jin Jung, Gyeonggi-do (KR); Keun-Woo Lee, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 36 days.

(21) Appl. No.: 16/121,147

(22) Filed: Sep. 4, 2018

(65) Prior Publication Data

US 2019/0267103 A1 Aug. 29, 2019

(30) Foreign Application Priority Data

Feb. 26, 2018 (KR) .................. 10-2018-0022796

(51) Int. Cl.
| | |
|---|---|
| *G11C 16/28* | (2006.01) |
| *G11C 16/16* | (2006.01) |
| *G11C 16/34* | (2006.01) |
| *G11C 11/56* | (2006.01) |
| *G11C 16/04* | (2006.01) |

(52) U.S. Cl.
CPC ............ *G11C 16/28* (2013.01); *G11C 16/16* (2013.01); *G11C 16/3427* (2013.01); *G11C 11/5635* (2013.01); *G11C 11/5642* (2013.01); *G11C 11/5671* (2013.01); *G11C 16/0483* (2013.01)

(58) Field of Classification Search
CPC ..... G11C 16/28; G11C 16/16; G11C 16/3427; G11C 16/0483; G11C 11/5635; G11C 11/5642; G11C 11/5671
USPC .................. 365/185.02, 185.29, 185.21
See application file for complete search history.

(56) References Cited

U.S. PATENT DOCUMENTS

| | | | | |
|---|---|---|---|---|
| 8,023,327 | B2 * | 9/2011 | Futatsuyama | G11C 11/5642 365/185.17 |
| 8,572,445 | B2 * | 10/2013 | Eguchi | G06F 11/073 365/200 |
| 2009/0323412 | A1 | 12/2009 | Mokhlesi et al. | |
| 2016/0172045 | A1 * | 6/2016 | Shukla | G11C 16/0483 365/185.12 |
| 2016/0210083 | A1 * | 7/2016 | Oh | G06F 3/0652 |

* cited by examiner

*Primary Examiner* — Connie C Yoha
(74) *Attorney, Agent, or Firm* — IP & T Group LLP

(57) ABSTRACT

A memory system includes: a memory device; and a non-erase block management device suitable for determining, when an erase operation is performed on a first memory block included in the memory device, whether to perform a read operation on a second word line of a second memory block, according to a location of a first word line, which is a target word line for a read operation on the second memory block, wherein the second word line includes a target word line for a dummy read operation.

20 Claims, 14 Drawing Sheets

610

|  | Erase Flag | Non-Erase Flag |
|---|---|---|
| Memory Block A | 0 | 0 |
| Memory Block B | 0 | 0 |
| Memory Block C | 0 | 0 |
| Memory Block D | 0 | 0 |
| Memory Block E | 0 | 0 |

FIG. 8

|  | Erase Flag | Non-Erase Flag |
|---|---|---|
| Memory Block A | 0→1 | 0 |
| Memory Block B | 0 | 0→1 |
| Memory Block C | 0 | 0→1 |
| Memory Block D | 0 | 0→1 |
| Memory Block E | 0 | 0→1 |

610

1st Memory Block — Memory Block A

2nd Memory Block — Memory Blocks B, C, D, E

MEMORY SYSTEM CAPABLE OF PREVENTING READ FAIL, INCLUDING READING A SECOND MEMORY BLOCK THROUGH A DUMMY READ OPERATION, WHEN AN ERASE OPERATION IS PERFORMED TO A FIRST MEMORY BLOCK, AND OPERATING METHOD THEREOF

CROSS-REFERENCE TO RELATED APPLICATION(S)

The present application claims priority under 35 U.S.C. § 119(a) to Korean Patent Application No. 10-2018-0022796, filed on Feb. 26, 2018, which is incorporated herein by reference in its entirety.

BACKGROUND

1. Field

Various exemplary embodiments of the present invention relate to a memory system and, more particularly, to a memory system capable of preventing read fail, and an operating method thereof.

2. Description of the Related Art

The emerging computer environment paradigm is ubiquitous computing, that is, computing systems that can be used anytime and anywhere. As a result, use of portable electronic devices such as mobile phones, digital cameras, and notebook computers has rapidly increased. These portable electronic devices generally use a memory system having one or more memory devices for storing data. A memory system in such device may be used as a main memory or an auxiliary memory.

Memory systems provide excellent stability, durability, high information access speed, and low power consumption since they have no moving parts. Examples of memory systems having such advantages include universal serial bus (USB) memory devices, memory cards having various interfaces, and solid-state drives (SSD).

Memory cells of memory devices have been implemented to have a 3-dimensional (3D) structure for storing more data, however, there may be an intrinsic concern because of the 3D structure.

More specifically, it has been reported that when an erase operation is performed to a first memory block in the memory device having a 3D structure, a hole may remain in a channel of a transistor included in a second memory block other than the first memory block.

Further, it is believed that there may occur an uncorrectable error in data stored in the second memory block due to the hole remaining in the channel of the transistor included in the second memory block when a read operation is subsequently performed to the second memory block, which may lead to a read fail of the second memory block.

It is further reported that such read fail may occur with a relatively high probability when a half page read operation, which has short channel initialization time, is performed to a bottom word line. Therefore, there is a need in addressing the aforementioned deficiencies of the art.

SUMMARY

Embodiments of the present invention are directed to a memory system capable of avoiding read fail by removing a hole remaining in a channel of a transistor included in a second memory block through a dummy read operation, when an erase operation is performed to a first memory block, and an operating method of the memory system.

In accordance with an embodiment of the present invention, a memory system includes: a memory device; and a non-erase block management device suitable for determining, when an erase operation is performed on a first memory block included in the memory device, whether to perform a read operation on a second word line of a second memory block, according to a location of a first word line, which is a target word line for a read operation on the second memory block, wherein the second word line includes a target word line for a dummy read operation.

The non-erase block management device may include: a flag table including an erase flag and a non-erase flag for each of the first memory block and the second memory block; and a stress-prevention read controller suitable for controlling the memory device to perform the read operation on the second word line based on the flag table.

The non-erase block management device may change, when an erase operation is performed on the first memory block, the erase flag corresponding to the first memory block from a value of logic low to a value of logic high and the non-erase flag corresponding to the second memory block from a value of logic low to a value of logic high.

The first word line may include one between a bottom word line region at a bottom of the second memory block and a non-bottom word line region other than the bottom word line region.

The non-erase block management device may control, when a read operation is performed on the non-bottom word line region, the memory device to perform a normal read operation on the non-bottom word line region.

The non-erase block management device may control, when a read operation is performed on the bottom word line region, the memory device to perform a stress prevention read operation of first performing a dummy read operation on the second word line and then performing a read operation on the bottom word line region.

The second word line may include one between a dummy word line and a top word line.

The non-erase block management device may change, when one between a normal read operation and the stress-prevention read operation is performed, the non-erase flag corresponding to the second memory block from a value of logic high to a value of low logic.

The second memory block may include a plurality of blocks, and the non-erase block management device may include the flag table including the erase flag and the non-erase flag for each of the plurality of blocks.

In accordance with an embodiment of the present invention, an operating method of a memory system, the method includes: performing an erase operation on a first memory block included in a memory device; determining, through a non-erase block management device, whether to perform a read operation on a second word line of a second memory block, which is a memory block other than the first memory block in the memory device, according to a location of a first word line, which is a target word line for a read operation on the second memory block, and performing a read operation on the second word line of the second memory block, wherein the second word line includes a target word line for a dummy read operation.

The performing of the read operation on the second word line of the second memory block may include generating a flag table including an erase flag and a non-erase flag for each of the first memory block and the second memory block; and controlling the memory device to perform the read operation on the second word line based on the flag table.

The performing of the read operation on the second word line of the second memory block may include changing, when an erase operation is performed on the first memory block, the erase flag corresponding to the first memory block from a value of logic low to a value of logic high and the non-erase flag corresponding to the second memory block from a value of logic low to a value of logic high.

The first word line may include one between a bottom word line region at a bottom of the second memory block and a non-bottom word line region other than the bottom word line region.

The performing of the read operation on the second word line of the second memory block may further include controlling, when a read operation is performed on the non-bottom word line region, the memory device to perform a normal read operation on the non-bottom word line region.

The performing of the read operation on the second word line of the second memory block may further include controlling, when a read operation is performed on the bottom word line region, the memory device to perform a stress-prevention read operation of first performing a dummy read operation on the second word line and then performing a read operation on the bottom word line region.

The second word line may include one between a dummy word line and a top word line.

The performing of the read operation on the second word line of the second memory block may further include changing, when one between a normal read operation and the stress-prevention read operation is performed, the non-erase flag corresponding to the second memory block from a value of logic high to a value of low logic.

The second memory block may include a plurality of blocks, and the flag table includes the erase flag and the non-erase flag for each of the plurality of blocks.

In accordance with an embodiment of the present invention, a memory system includes a memory device including a first memory block and a second memory block other than the first memory block; and a controller suitable for performing an erase operation on the first memory block, selectively performing a dummy read operation on a second word line of the second memory block based on a location of a first word line as a target word line for a read operation on the second memory block, and performing a substantial read operation on the first word line of the second memory block.

The controller may perform the dummy read operation on the second word line of the second memory block, when it is determined that the first word line belongs to a bottom word line region at a bottom of the second memory block.

These and other features and advantages of the present invention will become more apparent to the skilled person in the art of the invention from the following detailed description in conjunction with the following drawings.

BRIEF DESCRIPTION OF THE DRAWINGS

FIG. 8 is a diagram illustrating a change of a flag table in accordance with an embodiment of the present invention.

DETAILED DESCRIPTION

Figure 1:
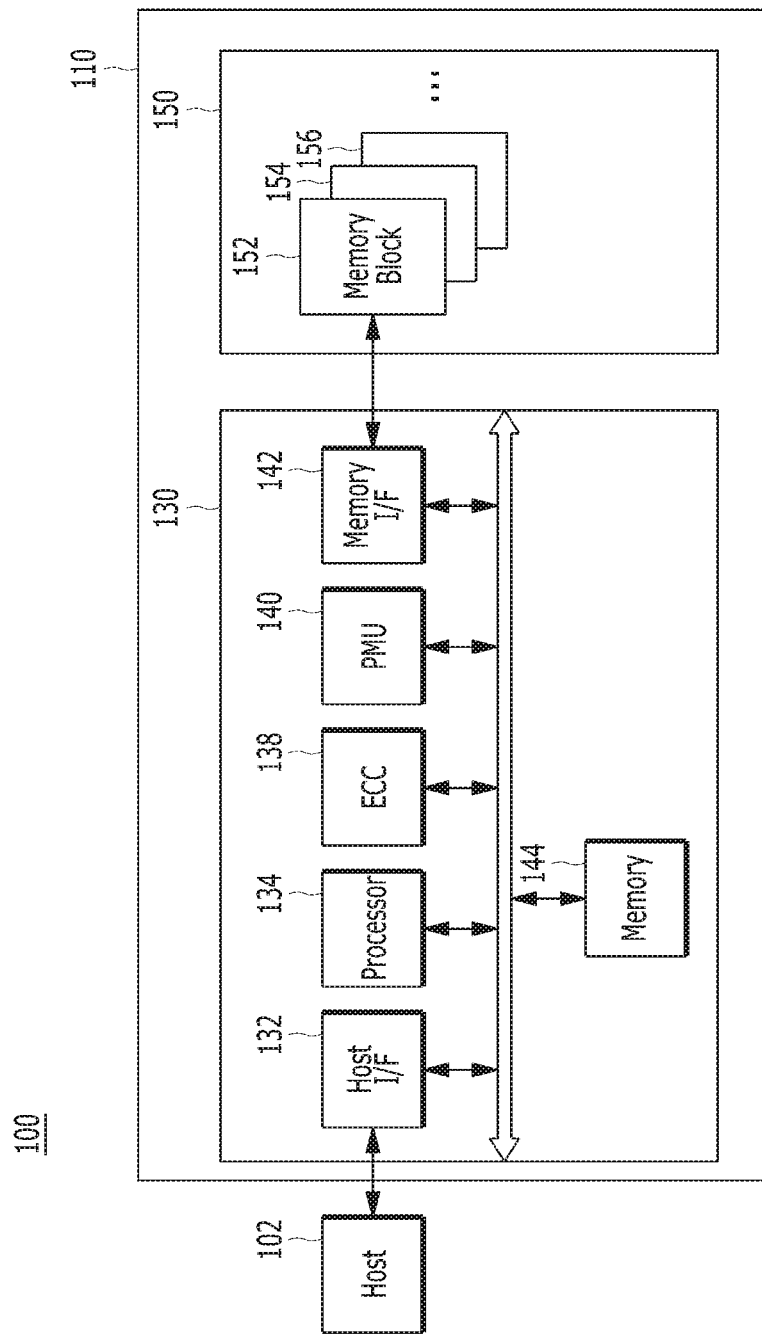
FIG. 1 is a block diagram illustrating a data processing system in accordance with an embodiment of the present invention.

Various embodiments of the present invention are described below in more detail with reference to the accompanying drawings. However, various elements and features of the present invention may be configured or arranged differently than shown in the described embodiments, as will be apparent to those skilled in the art in light of this disclosure. Thus, the present invention is not limited to the embodiments set forth herein. Rather, the described embodiments are provided so that this disclosure is thorough and complete and fully conveys the present invention to those skilled in the art to which this invention pertains. Moreover, reference to "an embodiment" does not necessarily mean only one embodiment, and different references to "an embodiment" are not necessarily to the same embodiment(s). Throughout the disclosure, like reference numerals refer to like parts throughout the various figures and embodiments of the present invention.

It will be understood that, although the terms "first", "second", "third", and so on may be used herein to identify various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate various features of the disclosed embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to limit the present invention. As used herein, singular forms are intended to include the plural forms and vice versa, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention pertains in view of the present disclosure. It will be further understood that terms, such as those defined in commonly used dictionaries, should be interpreted as having a meaning that is consistent with their meaning in the context of the present disclosure and the relevant art and not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Various embodiments of the present invention will be described in detail with reference to the attached drawings.

FIG. 1 is a block diagram illustrating a data processing system 100 in accordance with an embodiment of the present invention.

Referring to FIG. 1, the data processing system 100 may include a host 102 operatively coupled to a memory system 110.

The host 102 may include any of various portable electronic devices such as a mobile phone, MP3 player and laptop computer, or any of various non-portable electronic devices such as a desktop computer, game machine, television (TV), and projector.

The host 102 may include at least one operating system (OS), which may manage and control overall functions and operations of the host 102, and provide operation between the host 102 and a user using the data processing system 100 or the memory system 110. The OS may support functions and operations corresponding to the use purpose and usage of a user. For example, the OS may be divided into a general OS and a mobile OS, depending on the mobility of the host 102. The general OS may be divided into a personal OS and an enterprise OS, depending on the environment of a user. For example, the personal OS configured to support a function of providing a service to general users may include Windows and Chrome, and the enterprise OS configured to secure and support high performance may include Windows server, Linux and Unix. Furthermore, the mobile OS configured to support a function of providing a mobile service to users and a power saving function of a system may include Android, iOS and Windows Mobile. The host 102 may include a plurality of OSs, and execute an OS to perform an operation corresponding to a user's request on the memory system 110.

The memory system 110 may operate to store data for the host 102 in response to a request of the host 102. Non-limiting examples of the memory system 110 may include a solid-state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and micro-MMC, and the. The SD card may include a mini-SD card and micro-SD card.

The memory system 110 may be embodied by various types of storage devices. Examples of such storage devices may include, but are not limited to, volatile memory devices such as a DRAM dynamic random-access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM) and a flash memory. The flash memory may have a 3-dimensional (3D) stack structure.

The memory system 110 may include a controller 130 and a memory device 150. The memory device 150 may store data for the host 102, and the controller 130 may control data storage into the memory device 150.

The controller 130 and the memory device 150 may be integrated into a single semiconductor device, which may be included in the various types of memory systems as exemplified above. For example, the controller 130 and the memory device 150 may be integrated as one semiconductor device to constitute an SSD. When the memory system 110 is used as an SSD, the operating speed of the host 102 connected to the memory system 110 can be improved. In addition, the controller 130 and the memory device 150 may be integrated as one semiconductor device to constitute a memory card. For example, the controller 130 and the memory device 150 may constitute a memory card such as a PCMCIA (personal computer memory card international association) card, CF card, SMC (smart media card), memory stick, MMC including RS-MMC and micro-MMC, SD card including mini-SD, micro-SD and SDHC, or UFS device.

Non-limiting application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 may include a plurality of memory blocks 152, 154, 156 . . . (hereinafter, referred to as "memory blocks 152 to 156"). Each of the memory blocks may include a plurality of pages, and each of the pages may include a plurality of memory cells coupled to a word line. In an embodiment, the memory device 150 may be a flash memory. The flash memory may have a 3-dimensional (3D) stack structure.

Since the structure of the memory device 150 including its 3D stack structure will be described in detail later with reference to FIGS. 2 to 4, further description of these elements and features are omitted here.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program and erase operations of the memory device 150.

The controller 130 may include a host interface (I/F) 132, a processor 134, an error correction code (ECC) component 138, a power management unit (PMU) 140, a memory interface (I/F) 142 such as a NAND flash controller (NFC), and a memory 144 all operatively coupled via an internal bus.

The host interface 132 may be configured to process a command and data of the host 102, and may communicate with the host 102 through one or more of various interface protocols such as universal serial bus (USB), multi-media card (MMC), peripheral component interconnect-express (PCI-e or PCIe), small computer system interface (SCSI), serial-attached SCSI (SAS), serial advanced technology attachment (SATA), parallel advanced technology attachment (PATA), enhanced small disk interface (ESDI) and integrated drive electronics (IDE).

The ECC component 138 may detect and correct an error contained in the data read from the memory device 150. In other words, the ECC component 138 may perform an error correction decoding process to the data read from the memory device 150 through an ECC code used during an ECC encoding process. According to a result of the error correction decoding process, the ECC component 138 may output a signal, for example, an error correction success/fail signal. When the number of error bits is more than a threshold value of correctable error bits, the ECC component 138 may not correct the error bits, and may output an error correction fail signal.

The ECC component 138 may perform error correction through a coded modulation such as Low-Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC component 138 is not limited to any specific structure. The ECC component 138 may include all circuits, modules, systems or devices for error correction.

The PMU 140 may provide and manage power of the controller 130.

The memory I/F 142 may serve as a memory or storage interface for interfacing the controller 130 and the memory device 150 such that the controller 130 controls the memory device 150 in response to a request from the host 102. When the memory device 150 is a flash memory or specifically a NAND flash memory, the memory I/F 142 may generate a control signal for the memory device 150 and process data to be provided to the memory device 150 under the control of the processor 134. The memory I/F 142 may work as an interface (e.g., a NAND flash interface) for processing a command and data between the controller 130 and the memory device 150. Specifically, the memory I/F 142 may support data transfer between the controller 130 and the memory device 150.

The memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by a static random-access memory (SRAM) or dynamic random-access memory (DRAM). The memory 144 may be disposed within or out of the controller 130. FIG. 1 exemplifies the memory 144 disposed within the controller 130. In an embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL). Also, the processor 134 may be realized as a microprocessor or a central processing unit (CPU).

For example, the controller 130 may perform an operation requested by the host 102 in the memory device 150 through the processor 134, which is realized as a microprocessor or a CPU. In other words, the controller 130 may perform a command operation corresponding to a command received from the host 102, or another source. The controller 130 may perform a foreground operation as the command operation corresponding to the command received from the host 102. For example, the controller 130 may perform a program operation corresponding to a write command, a read operation corresponding to a read command, an erase operation corresponding to an erase command, and a parameter set operation corresponding to a set parameter command or a set feature command.

Also, the controller 130 may perform a background operation onto the memory device 150 through the processor 134, which is realized as a microprocessor or a CPU. Examples of the background operation may include an operation of copying and processing data stored in some memory blocks among the memory blocks 152 to 156 of the memory device 150 into other memory blocks, e.g., a garbage collection (GC) operation. Examples of the background operation may include an operation of swapping between the memory blocks 152 to 156 or between the data of the memory blocks 152 to 156, e.g., a wear-leveling (WL) operation. Examples of the background operation may include an operation of storing the map data stored in the controller 130 in the memory blocks 152 to 156, e.g., a map flush operation. Examples of the background operation may include an operation of managing bad blocks of the memory device 150, e.g., a bad block management operation of detecting and processing bad blocks among the memory blocks 152 to 156.

A memory device of the memory system in accordance with an embodiment of the present invention is described in detail with reference to FIGS. 2 to 4.

Figure 2:
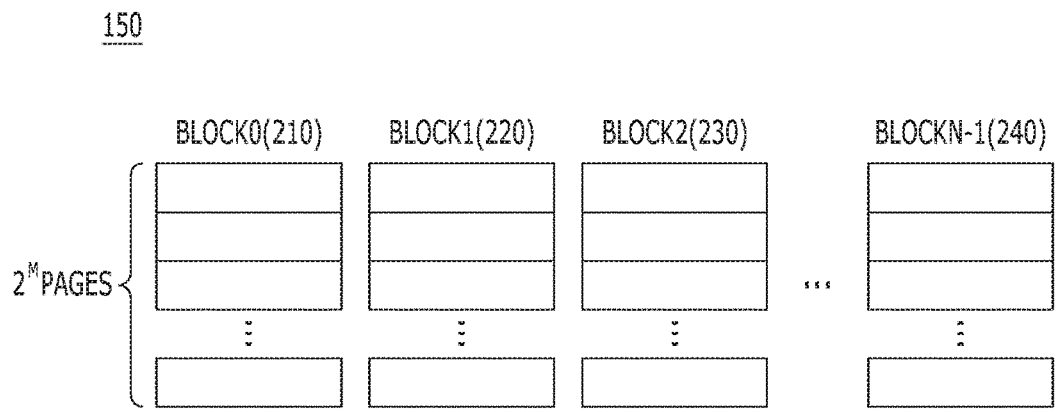
FIG. 2 is a schematic diagram illustrating an exemplary configuration of a memory device employed in a memory system of FIG. 1.
Figure 3:
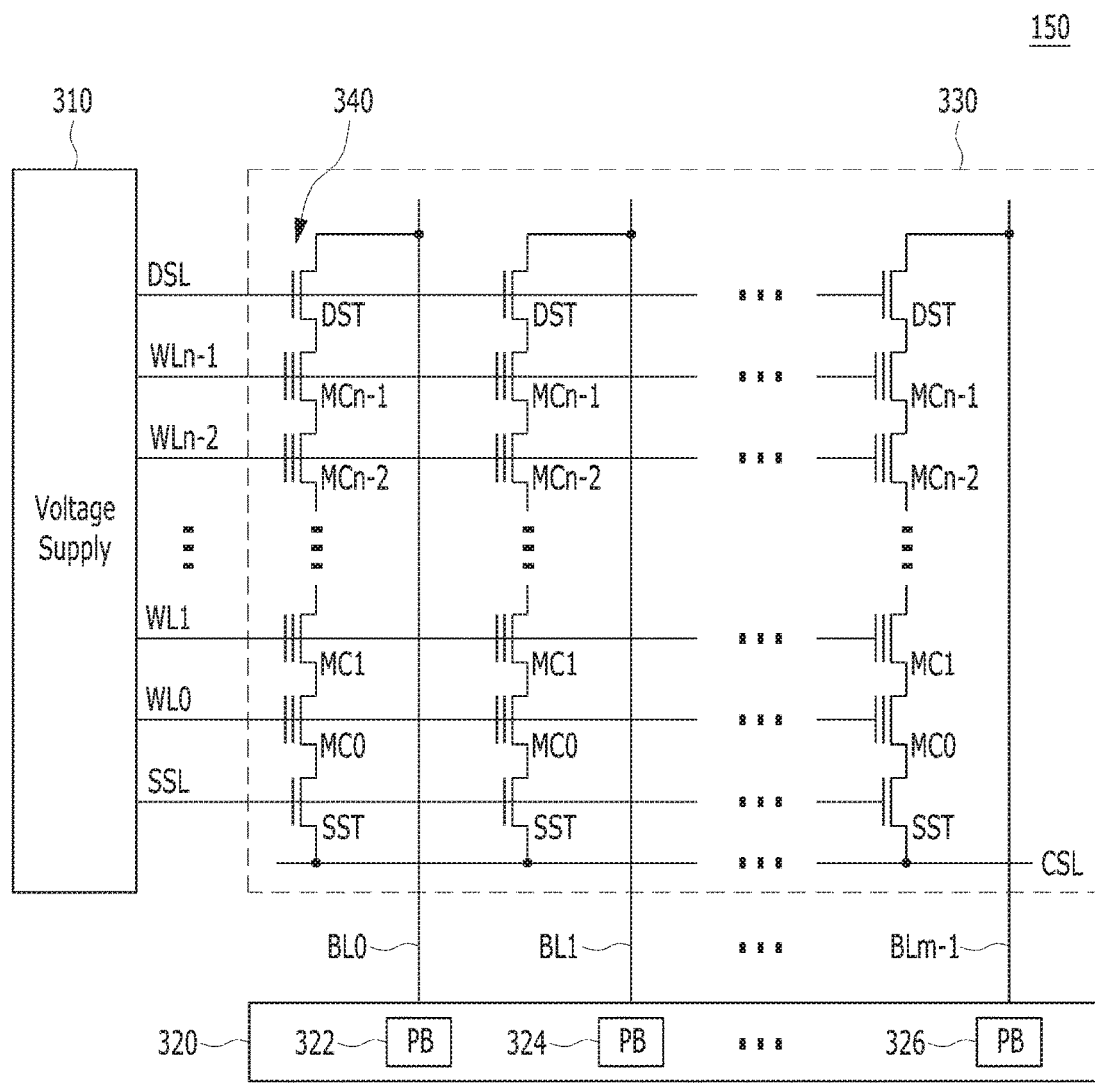
FIG. 3 is a circuit diagram illustrating an exemplary configuration of a memory cell array of a memory block in a memory device shown in FIG. 1.
Figure 4:
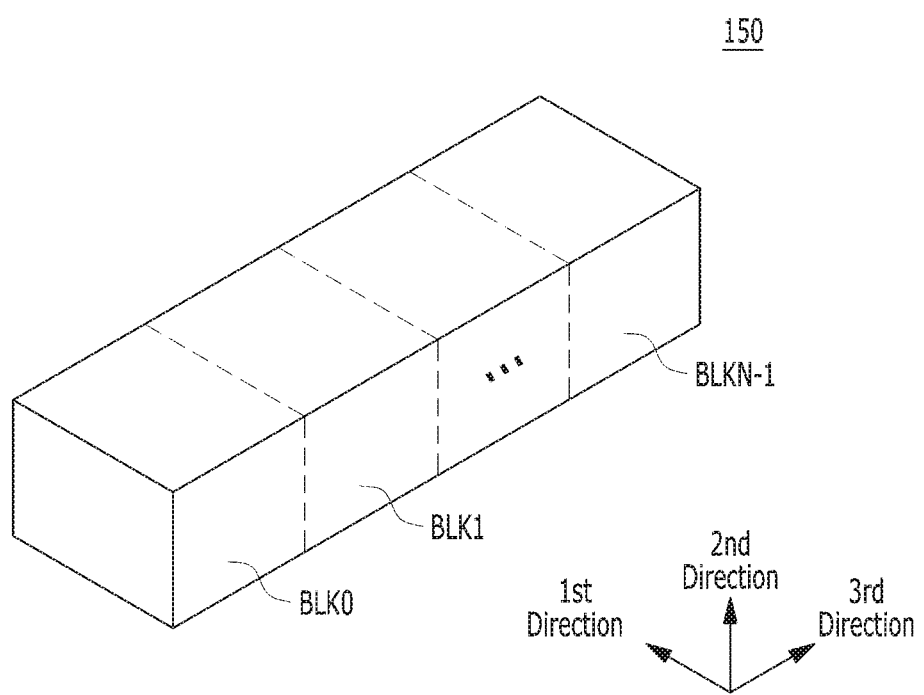
FIG. 4 is a schematic diagram illustrating an exemplary three-dimensional (3D) structure of the memory device of FIG. 2.

FIG. 2 is a schematic diagram illustrating the memory device 150, FIG. 3 is a circuit diagram illustrating an exemplary configuration of a memory cell array of a memory block 330 in the memory device 150, and FIG. 4 is a schematic diagram illustrating an exemplary 3D structure of the memory device 150.

Referring to FIG. 2, the memory device 150 may include a plurality of memory blocks, e.g., a memory block 0 (BLK0) 210, a memory block 1 (BLK1) 220, a memory block 2 (BLK2) 230, and a memory block N-1 (BLKN-1) 240. Each of the memory blocks 210, 220, 230 and 240 may include a plurality of pages, for example $2^M$ pages, the number of which may vary according to circuit design. For example, in some applications, each of the memory blocks may include M pages. Each of the pages may include a plurality of memory cells that are coupled to a plurality of word lines WL.

Each of memory blocks may include a single level cell (SLC) memory block storing 1-bit data, a multi-level cell (MLC) memory block storing 2-bit data, or the combination of the SLC memory block and the MLC memory block. The SLC memory blocks may include a plurality of pages that are realized by memory cells storing one-bit data in one memory cell. The SLC memory blocks may have a quick data operation and high durability. The MLC memory blocks may include a plurality of pages that are realized by memory cells storing multi-bit data, e.g., data of two or more bits, in one memory cell. The MLC memory blocks may have a greater data storing space than the SLC memory blocks. In other words, the MLC memory blocks may be highly integrated. In an embodiment, the memory device 150 may include the MLC memory blocks, each of which includes a plurality of pages that are realized by memory cells capable of storing two-bit data in one memory cell. In an embodiment, the memory device 150 may include triple level cell (TLC) memory blocks each of which includes a plurality of pages that are realized by memory cells capable of storing three-bit data in one memory cell. In an embodiment, the memory device 150 may include quadruple level cell (QLC) memory blocks each of which includes a plurality of pages that are realized by memory cells capable of storing four-bit data in one memory cell. In an embodiment, the memory device 150 may include multiple level cell memory blocks each of which includes a plurality of pages that are realized by memory cells capable of storing five or more-bit data in one memory cell, and so forth.

In accordance with an embodiment of the present invention, the memory device 150 is described as a non-volatile memory, such as a flash memory, e.g., a NAND flash memory. However, the memory device 150 may be realized as any of a phase change random access memory (PCRAM), a resistive random access memory (RRAM or ReRAM), a ferroelectric random access memory (FRAM), a spin transfer torque magnetic random access memory (STT-RAM or STT-MRAM).

The memory blocks 210, 220, 230 and 240 may store the data transferred from the host 102 through a program operation, and transfer data stored therein to the host 102 through a read operation.

Referring to FIG. 3, a memory block 330 may correspond to any of the plurality of memory blocks 152 to 156 included in the memory device 150 of the memory system 110. The memory block 330 may include a plurality of cell strings 340 coupled to a plurality of corresponding bit lines BL0 to BLm-1. The cell string 340 of each column may include one or more drain select transistors DST and one or more source select transistors SST. Between the source and drain transistors SST and DST, a plurality of memory cells MC0 to MCn-1 may be coupled in series. In an embodiment, each of the memory cell transistors MC0 to MCn-1 may be embodied by an MLC capable of storing data of a plurality of bits. Each of the cell strings 340 may be electrically coupled to a corresponding bit line among the plurality of bit lines BL0 to BLm-1. For example, as illustrated in FIG. 3, the first cell string is coupled to the first bit line BL0, and the last cell string is coupled to the last bit line BLm-1.

Although FIG. 3 illustrates NAND flash memory cells, the invention is not limited in this way. It is noted that the memory cells may be NOR flash memory cells, or hybrid flash memory cells including two or more types of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply 310 which provides word line voltages including a program voltage, a read voltage and a pass voltage to supply to the word lines according to an operation mode. The voltage generation operation of the voltage supply 310 may be controlled by a control circuit (not illustrated). Under the control of the control circuit, the voltage supply 310 may select one of the memory blocks (or sectors) of the memory cell array, select one of the word lines of the selected memory block, and provide the word line voltages to the selected word line and the unselected word lines as may be needed.

The memory device 150 may include a read and write (read/write) circuit 320 which is controlled by the control circuit. During a verification/normal read operation, the read/write circuit 320 may operate as a sense amplifier for reading data from a certain memory cell array of the memory block 330. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers (PBs) 322 to 326 respectively corresponding to columns (or bit lines) or column pairs (or bit line pairs). Each of the page buffers 322 to 326 may include a plurality of latches (not illustrated).

The memory device 150 may be embodied by a two-dimensional (2D) or three-dimensional (3D) memory device. Particularly, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN-1. FIG. 4 is a block diagram illustrating a plurality of memory blocks BLK0 to BLKN-1 corresponding to the memory blocks 152 to 156 of the memory device 150 shown in FIG. 1. Each of the memory blocks 152 to 156 may be realized in a 3D structure (or vertical structure). For example, the memory blocks 152 to 156 may be a 3D structure with dimensions extending in first to third directions, e.g., an x-axis direction, a y-axis direction, and a z-axis direction.

Each memory block included in the memory device 150 may include a plurality of NAND strings NS that are extended in the second direction, and a plurality of NAND strings NS that are extended in the first direction and the third direction. Each of the NAND strings NS may be coupled to a bit line BL, at least one source selection line SSL, at least one drain selection line DSL, a plurality of word lines WL, at least one dummy word line DWL (not shown), and a common source line CSL, and each of the NAND strings NS may include a plurality of transistor structures TS.

In short, each memory block among the memory blocks 152 to 156 of the memory device 150 may be coupled to a plurality of bit lines BL, a plurality of source selection lines SSL, a plurality of drain selection lines DSL, a plurality of word lines WL, a plurality of dummy word lines DWL (not shown), and a plurality of common source lines CSL, and each memory block may include a plurality of NAND strings NS. Also, in each memory block, one-bit line BL may be coupled to a plurality of NAND strings NS to realize a plurality of transistors in one NAND string NS. Also, a drain selection transistor DST of each NAND string NS may be coupled to a corresponding bit line BL, and a source selection transistor SST of each NAND string NS may be coupled to a common source line CSL. Memory cells MC may be provided between the source selection transistor SST and the drain selection transistor DST of each NAND string NS. In other words, a plurality of memory cells may be realized in each memory block of the memory blocks 152 to 156 of the memory device 150.

A data processing operation toward a memory device, particularly, a data processing operation performed when a plurality of command operations corresponding to a plurality of commands are performed, in a memory system in accordance with an embodiment of the present invention is described in detail with reference to FIGS. 5 to 11.

As described with reference to FIG. 3, a memory cell of the memory device 150 may be implemented to have a 3D structure to store more data.

As a memory cell of a memory device is implemented to have a 3-dimension (3D) structure to store more data, there may be an intrinsic concern of the 3D structure. As to a memory device having memory cells of a 2D structure, an erase operation is performed such that a reverse bias voltage is applied to P-wells and electrons trapped in floating gates of the memory cells are emitted to the P-wells. However, memory cells of a 3D structure may not have the P-wells and may have channels floating. Therefore, an erase operation may be performed to a memory device having memory cells of a 3D structure by utilizing the gate induced drain leakage (GIDL) effect. According to the GIDL effect, a leakage current flows when an electric field is applied in a direction from a drain to a gate of a transistor under the situation that the drain and the gate are overlapped.

Figure 5:
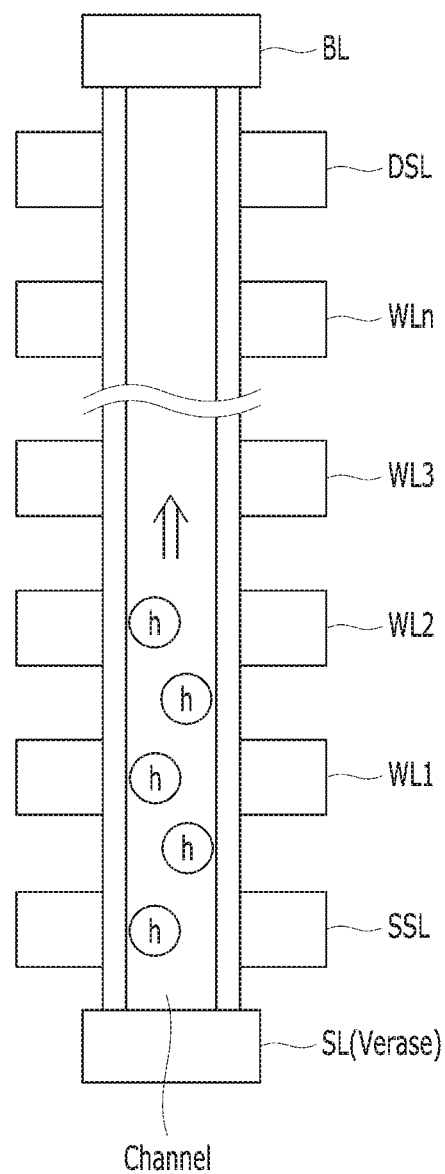
FIG. 5 is a diagram illustrating a phenomenon occurring in a channel of memory cells in a non-erase target block due to the GIDL effect.

FIG. 5 is a diagram illustrating a phenomenon occurring in a channel of memory cells in a non-erase target block as well as an erase target block due to the GIDL effect.

For illustration, FIG. 5 shows a string included in a non-erase target block during an erase operation. A non-erase target block may share a source line SL with an erase target block. Therefore, an erase voltage Verase may be applied to the source line SL shared by the erase target block and the non-erase target block during an erase operation to the erase target block. At this time, a source selection line SSL is floated and thus the GIDL effect may occur due to a voltage difference between the source line SL and the source selection line SSL. A hole may be emitted into a channel of the non-erase target block due to the voltage difference between the source line SL and the source selection line SSL. Since word lines coupled to memory cells are floated as well as the source selection line SSL in the non-erase target block, the hole emitted into the channel may be trapped thereto while not being tunneled into the memory cells in the non-erase target block.

Figures 6, 7:
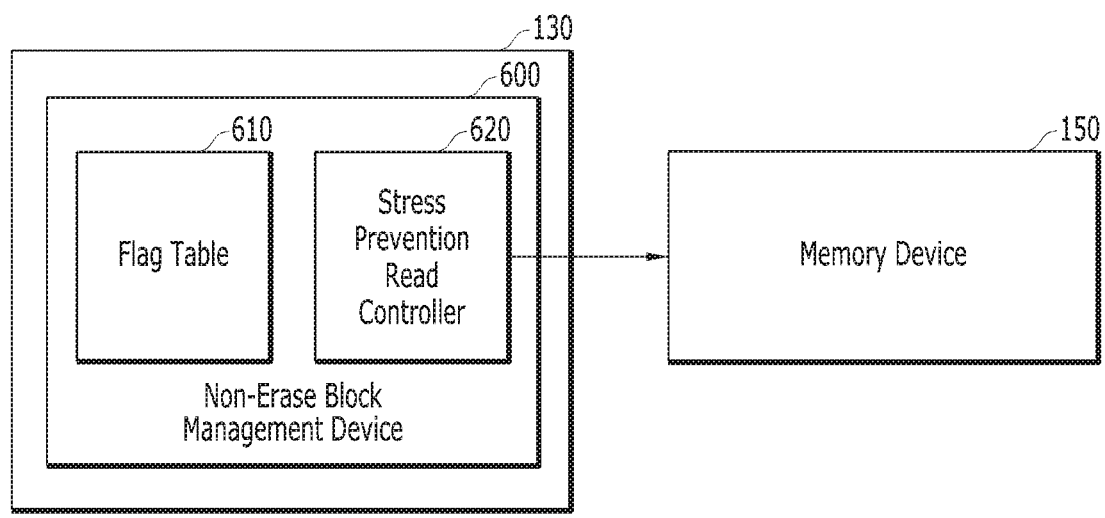
FIG. 6 is a block diagram illustrating a memory system in accordance with an embodiment of the present invention.
FIG. 7 is a diagram illustrating a flag table in accordance with an embodiment of the present invention.

FIG. 6 is a block diagram illustrating a memory system for managing a non-erase target block in accordance with an embodiment of the present invention.

Referring to FIG. 6, the controller 130 may include a non-erase block management device 600.

The controller 130 may control the memory device 150 to perform an erase operation to a first memory block. The first memory block is also referred herein to as an erase target block.

During the erase operation to the first memory block, holes may remain in channels of memory cells in a second memory block due to the gate induced drain leakage (GIDL) effect. The second memory block is also referred to herein as a non-target erase memory block.

During a read operation which is subsequently performed on the second memory block following the erase operation on the first memory block, an uncorrectable error may occur in the data stored in the second memory block due to the holes remaining in the channels of the memory cells included in the second memory block, which may lead to a read fail of the second memory block.

Such read fail may occur with a higher probability when a half page read operation, which has a short channel initialization time, is performed to a bottom word line.

In order to prevent such read fail from occurring, the non-erase block management device 600 of the present invention can control the memory device 150 to perform a stress prevention read operation.

The stress prevention read operation may include a dummy read operation and a substantial read operation. During the dummy read operation, the holes remaining in the channels of the memory cells included in the second memory block may be removed. During the substantial read operation, a read operation may be substantially performed on the bottom word line of the second memory block.

When a read operation is to be performed to a first word line as a target word line of the second memory block and the first word line is the bottom word line, that is, the first word line is located in a bottom word line region, which is a bottom of the second memory block, the non-erase block management device 600 may control the memory device 150 to perform the stress prevention read operation on the first word line.

The stress prevention read operation may be performed on the first word line as the bottom word line of the second memory block since the read fail occurs in the first word line with a relatively high probability. Also, the stress prevention read operation may be performed on the first word line in order to minimize the latency of the dummy read operation.

The non-erase block management device 600 may determine whether to perform a read operation on a second word line of the second memory block according to the location of the first word line.

The second word line may be a target word line of the dummy read operation. The second word line may be one between a dummy word line and a top word line of the second memory block.

As illustrated in FIG. 6, the non-erase block management device 600 may include a flag table 610 and a stress-prevention read controller 620.

The flag table 610 may include an erase flag and a non-erase flag for each of the first memory block and the second memory block.

The stress prevention read controller 620 may control the read operation on the second word line based on the flag table 610.

FIG. 7 is a diagram illustrating a flag table in accordance with an embodiment of the present invention, for example, the flag table 610 of FIG. 6.

Referring to FIG. 7, the flag table 610 may include an erase flag and a non-erase flag for each of a plurality of memory blocks included in the memory device 150.

The erase flag may indicate whether an erase operation is performed on a corresponding memory block.

The erase flag having a value of logic low may indicate that an erase operation is not performed on a corresponding memory block for a predetermined time. The erase flag having a value of logic high may indicate that an erase operation is performed on a corresponding memory block within the predetermined time.

The erase flag having a value of logic high may change to a value of logic low after the predetermined number has elapsed.

The non-erase flag may indicate whether a corresponding memory block is or is not a non-erase target block.

The non-erase flag having a value of logic low may indicate that a corresponding memory block is not a non-erase target block. The non-erase flag having a value of logic high may indicate that a corresponding memory block is a non-erase target block.

The non-erase flag having a value of logic high may change to a value of logic low after the predetermined number has elapsed. Also, the non-erase flag having a value of logic high may change to a value of logic low after the completion of the stress prevention read operation.

FIG. 8 is a diagram illustrating a change of a flag table in accordance with an embodiment of the present invention, for example, the change of the flag table 610 of FIG. 6 when an erase operation is performed on a memory block A.

The memory block A may become the first memory block since an erase operation is performed on the memory block A.

Each of memory blocks B to E may become the second memory block since any erase operation is not yet performed on any one among the memory blocks B to E.

When an erase operation is performed on the memory block A (i.e., the first memory block) within the predetermined time, the non-erase block management device 600 of FIG. 6 may change the erase flag corresponding to the memory block A (i.e., the first memory block), which has a value of logic low, to have a value of logic high.

Since any erase operation is not yet performed to any one of the memory blocks B to E (i.e., the second memory blocks), the non-erase block management device 600 may change the non-erase flags corresponding to the memory blocks B to E (i.e., the second memory blocks), which have a value of logic low, to have a value of logic high.

Figure 9:
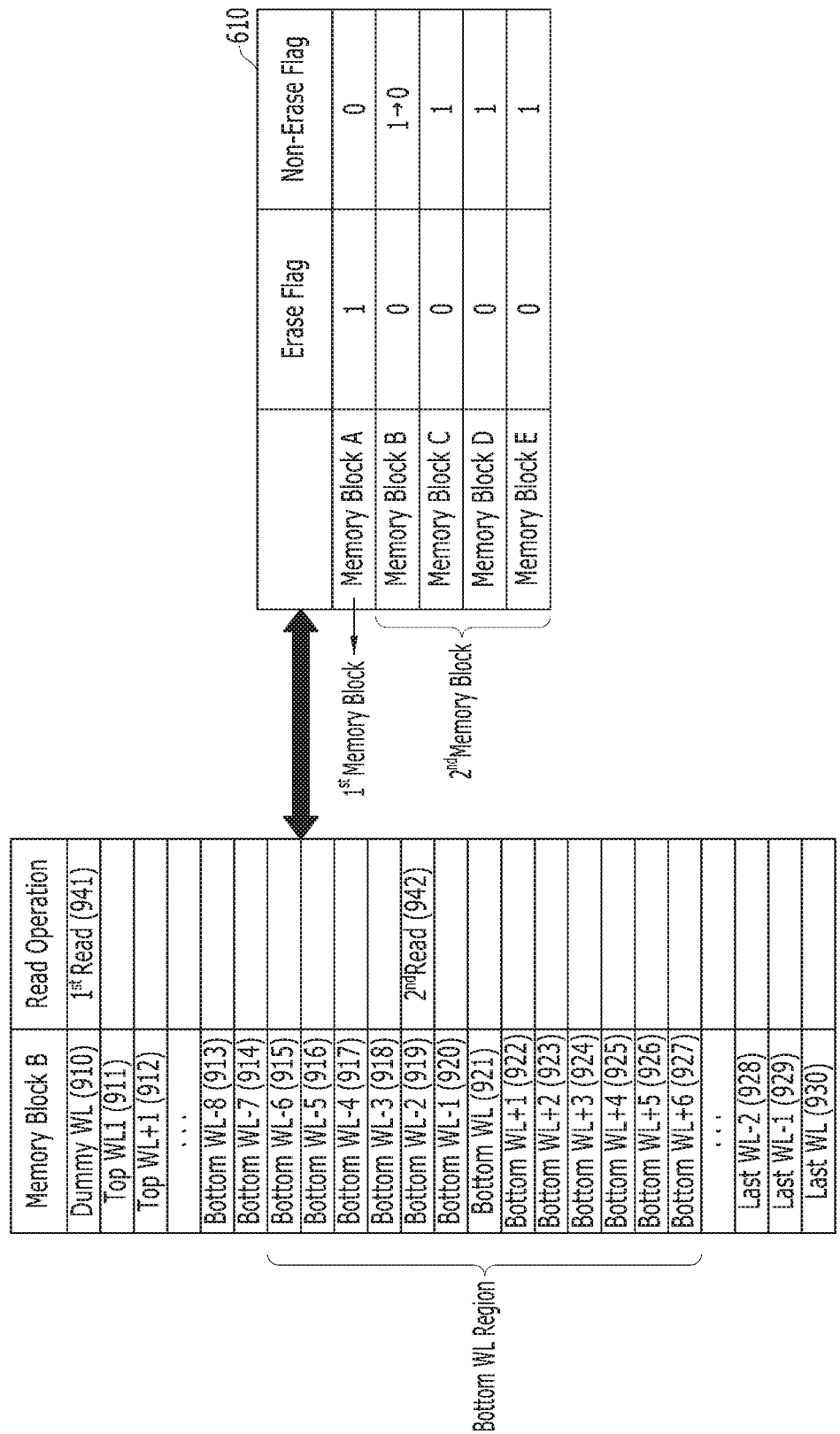
FIG. 9 is a diagram illustrating a relationship between read operations on a memory block and a change of a flag table in accordance with an embodiment of the present invention.

FIG. 9 is a diagram illustrating a relationship between read operations on a memory block and a change of a flag table in accordance with an embodiment of the present invention. For example, FIG. 9 illustrates word lines of the memory block B or the second memory block and the change of the flag table 610.

Referring to FIG. 9, the memory block B may be coupled to a plurality of word lines, which are divided into several regions.

For example, the plurality of word lines coupled to the memory block B may be divided into word lines of a dummy word line region, word lines of a top word line region, word lines of a bottom word line region and word lines of a last word line region. However, such division is merely an example. Generally, the plurality of word lines coupled to the memory block B may be divided into a plurality of regions according to the locations and characteristics of the word lines.

Word lines in the bottom word line region may be a bottom word line 921, six (6) word lines previous to the bottom word line 921 and six (6) word lines subsequent to the bottom word line 921, that is, word lines from a word line 915 (denoted as "Bottom WL−6") to a word line 927 (denoted as "Bottom WL+6").

When a read operation is performed on word lines included in the bottom word line region, there may exist a relatively high probability of read fail due to the characteristics of the bottom word lines, as described above.

Therefore, in order to prevent the read fail, the non-erase block management device 600 of FIG. 6 may control the memory device 150 to perform a first read operation 941 on the dummy word line 910 through the stress prevention read controller 620.

Then, the non-erase block management device 600 may control the memory device 150 to perform a second read operation 942 on a target word line, for example, a bottom word line 919 (denoted as "Bottom WL−2") among word lines in the bottom word line region.

The dummy word line 910 may be the second word line and the first read operation 941 may be the dummy read operation. The first read operation 941 and the second read operation 942 may be included in the stress prevention read operation.

Although not illustrated, the non-erase block management device 600 may control the memory device 150 to perform the dummy read operation on a word line (e.g., the top word line 911) adjacent to the dummy word line 910 through the stress prevention read controller 620.

The second read operation may be performed on the top word line 911, with reference to which the read fail hardly occurs since it is far enough from the bottom word line region.

Also, the non-erase block management device 600 may change the value of the non-erase flag corresponding to the memory block B from a value of logic high to a value of logic low.

Then, even when an additional read operation is performed on a word line in the bottom word line region of the memory block B, the stress prevention read operation may not need to be performed since the holes do not remain any more in the channels of memory cells in the memory block B.

Therefore, the stress prevention read controller 620 may control the memory device 150 to perform a normal read operation other than the stress prevention read operation by identifying the non-erase flag having a value of logic low in the flag table 610.

Figure 10:
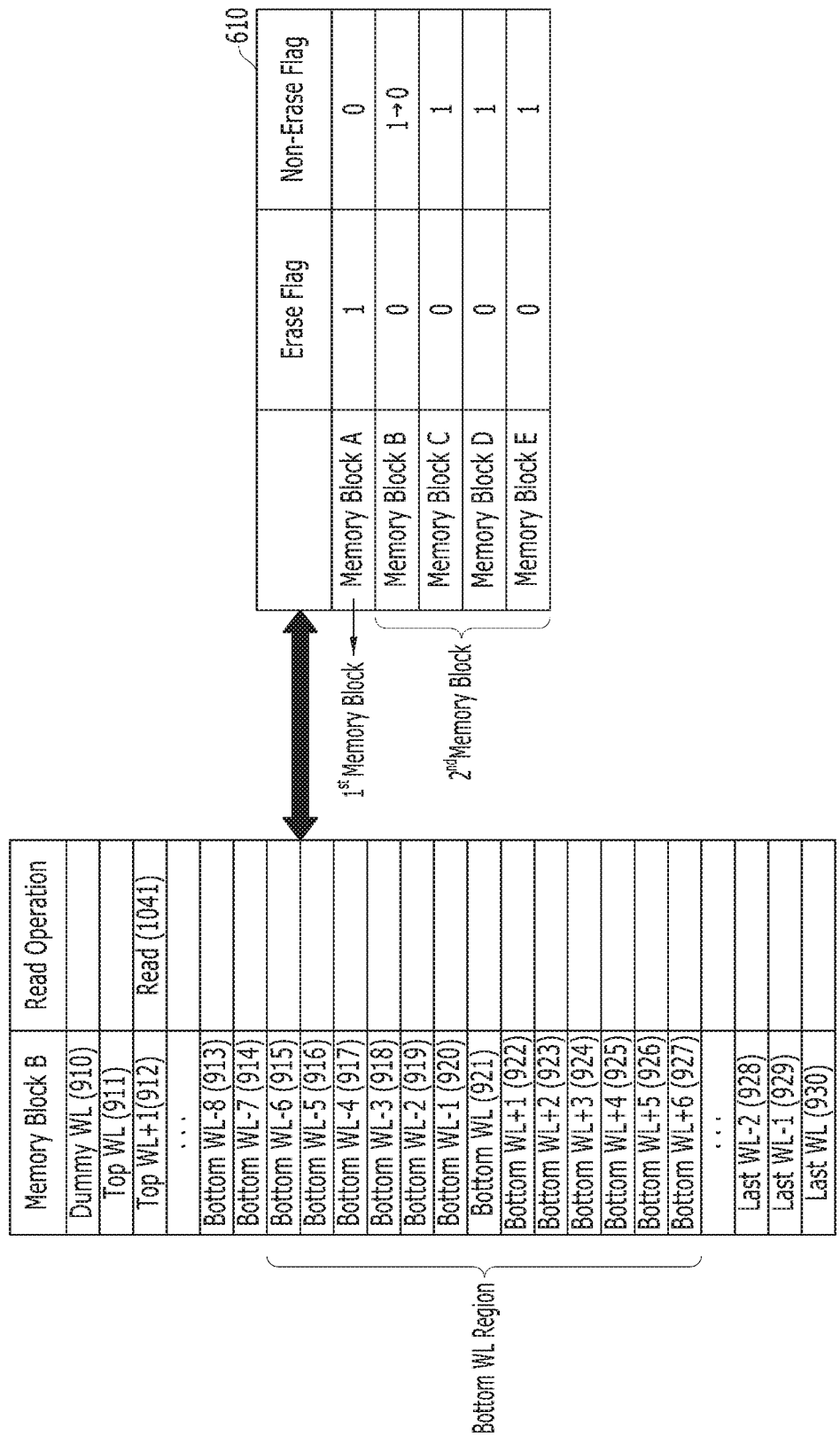
FIG. 10 is a diagram illustrating a relationship between read operations on a memory block and a change of a flag table in accordance with an embodiment of the present invention.

FIG. 10 is a diagram illustrating a relationship between read operations on a memory block and a change of a flag table in accordance with an embodiment of the present invention. For example, FIG. 10 illustrates word lines of the memory block B as the second memory block and the change of the flag table 610.

Referring to FIG. 10, when a read operation 1041 is performed on a top word line 912 (denoted as "Top WL+1"), the top word line 912 is included in a word line region other than the bottom word line region and thus the non-erase block management device 600 of FIG. 6 may control the memory device 150 to perform the read operation 1041 on the top word line 912 without performing the dummy read operation. That is, the non-erase block management device 600 may perform a normal read operation on the top word line 912.

Also, the non-erase block management device 600 may change, in the flag table 610, the value of the non-erase flag corresponding to the memory block B from a value of logic high to a value of logic low.

Then, even when an additional read operation is performed on a word line in the bottom word line region of the memory block B, the stress prevention read operation may not need to be performed since the holes do not remain any more in the channels of memory cells in the memory block B.

Therefore, the stress prevention read controller 620 may control the memory device 150 to perform a normal read operation other than the stress prevention read operation by identifying the non-erase flag having a value of logic low in the flag table 610.

Figure 11:
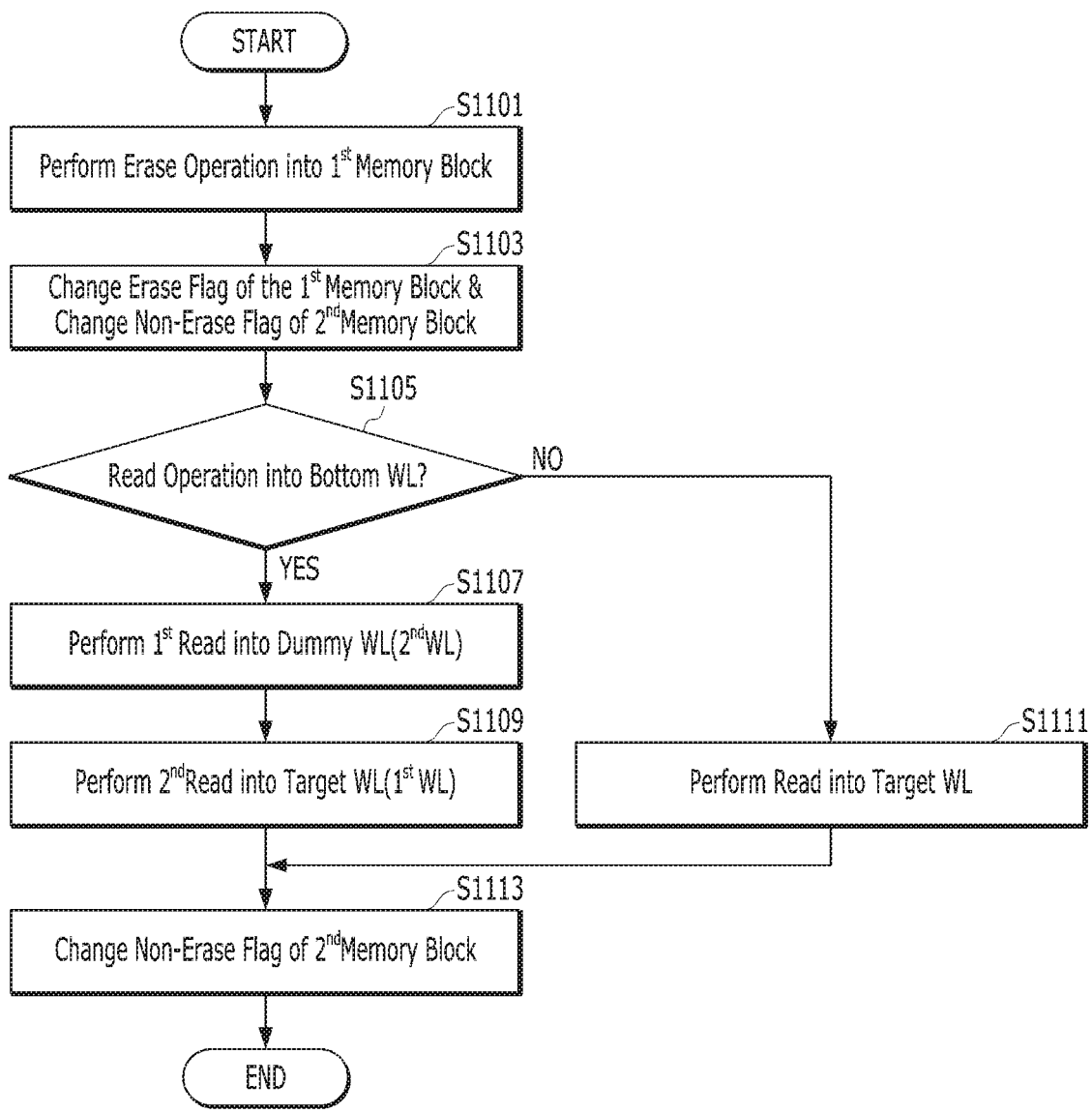
FIG. 11 is a flowchart illustrating an operating method of a memory system in accordance with an embodiment of the present invention.

FIG. 11 is a flowchart illustrating an operating method of a memory system, for example, the memory system including a controller 130 and a memory device 150, as shown in FIG. 6, in accordance with an embodiment of the present invention.

At step S1101, the controller 130 may control the memory device 150 to perform an erase operation to the first memory block. The first memory block may be the one on which an erase operation is performed. When an erase operation is performed on the second memory block after an erase operation is performed on the first memory block, there may be a possibility that an uncorrectable error occurs due to holes remaining in channels of memory cells included in the second memory block, which may cause a read fail.

At step S1103, the non-erase block management device 600 may change the erase flag corresponding to the first memory block since the erase operation is performed to the first memory block for a predetermine time. That is, the non-erase block management device 600 may change the erase flag from a value of logic low to logic high.

Also, the non-erase block management device 600 may change the non-erase flag corresponding to the second memory block since an erase operation is not yet performed to the second memory block or the second memory block is a non-erase target block. That is, the non-erase block management device 600 may change the non-erase flag from a value of logic low to logic high.

At step S1105, the non-erase block management device 600 may determine whether a word line as a target word line for a read operation is included in the bottom word line region or in the non-bottom word line region.

When the target word line for a read operation is determined to be included in the bottom word line region, at step S1107, the non-erase block management device 600 may control the memory device 150 to perform a first read operation on the dummy word line through the stress prevention read controller 620. The dummy word line may be the second word line.

At step S1109, the non-erase block management device 600 may control the memory device 150 to perform a second read operation on the target word line for a read operation among word lines included in the bottom word line region. The target word line may be the first word line.

When the target word line for a read operation is determined to be included in the non-bottom word line region, that is, when it is determined that the target word line is not included in the bottom word line region, at step S1111, the non-erase block management device 600 may control the memory device 150 to perform a read operation on the target word line for the read operation among word lines included in the non-bottom word line region without the dummy read operation. That is, the non-erase target block management device 600 may control the memory device 150 to perform a normal read operation on the target word line.

At step S1113, the non-erase block management device 600 may change the non-erase flag corresponding to the second memory block to have a value of from logic high to logic low. Then, even when an additional read operation is performed on a word line in the bottom word line region of the second memory block, the stress prevention read operation may not need to be performed since the holes do not remain any more in the channels of memory cells in the second memory block.

Therefore, the stress prevention read controller 620 may control the memory device 150 to perform a normal read operation other than the stress prevention read operation by identifying the non-erase flag having a value of logic low in the flag table 610.

FIGS. 12 to 20 are diagrams schematically illustrating application examples of the data processing system of FIGS. 1 to 11 according to various embodiments.

Figure 12:
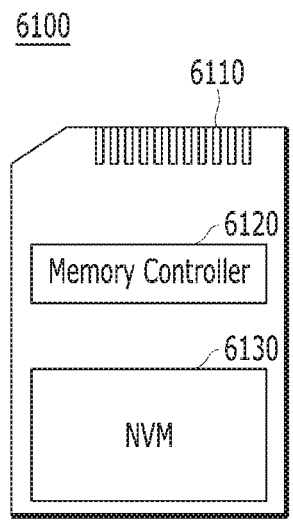
FIGS. 12 to 20 are diagrams illustrating application examples of a data processing system in accordance with various embodiments of the present invention.

FIG. 12 is a diagram schematically illustrating the data processing system including the memory system in accordance with an embodiment. FIG. 12 schematically illustrates a memory card system 6100 to which the memory system in accordance with an embodiment is applied.

Referring to FIG. 12, the memory card system 6100 may include a memory controller 6120, a memory device 6130 and a connector 6110.

More specifically, the memory controller 6120 may be connected to the memory device 6130 embodied by a nonvolatile memory (NVM), and configured to access the memory device 6130. For example, the memory controller 6120 may be configured to control read, write, erase and background operations of the memory device 6130. The memory controller 6120 may be configured to provide an interface between the memory device 6130 and a host (not shown), and drive firmware for controlling the memory device 6130. That is, the memory controller 6120 may correspond to the controller 130 of the memory system 110 described with reference to FIG. 1, and the memory device 6130 may correspond to the memory device 150 of the memory system 110 described with reference to FIG. 1.

Thus, as shown in FIG. 1, the memory controller 6120 may include a random-access memory (RAM), a processor, a host interface, a memory interface and an error correction component.

The memory controller 6120 may communicate with an external device, for example the host 102 of FIG. 1, through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with an embodiment may be applied to wired/wireless electronic devices or particularly mobile electronic devices.

The memory device 6130 may be implemented by a nonvolatile memory. For example, the memory device 6130 may be implemented by any of various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM).

The memory controller 6120 and the memory device 6130 may be integrated into a single semiconductor device. For example, the memory controller 6120 and the memory device 6130 may be integrated to form a solid-state driver (SSD). Also, the memory controller 6120 and the memory device 6130 may form a memory card such as a PC card (e.g., Personal Computer Memory Card International Association (PCMCIA)), a compact flash (CF) card, a smart media card (e.g., SM and SMC), a memory stick, a multimedia card (e.g., MMC, RS-MMC, MMCmicro and eMMC), a secure digital (SD) card (e.g., SD, miniSD, microSD and SDHC) and a universal flash storage (UFS).

Figure 13:
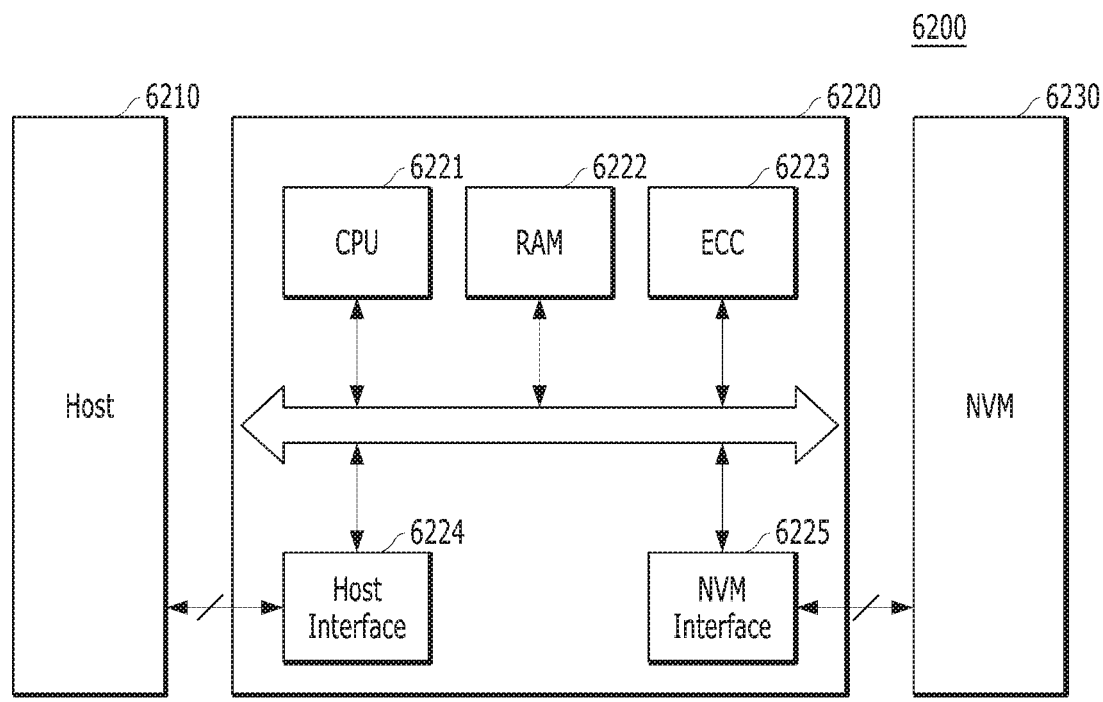

FIG. 13 is a diagram schematically illustrating another example of a data processing system 6200 including the memory system in accordance with an embodiment.

Referring to FIG. 13, the data processing system 6200 may include a memory device 6230 having one or more nonvolatile memories (NVMs) and a memory controller 6220 for controlling the memory device 6230. The data processing system 6200 may serve as a storage medium such as a memory card (e.g., CF, SD, micro-SD or the like) or USB device, as described with reference to FIG. 1. The memory device 6230 may correspond to the memory device 150 in the memory system 110 illustrated in FIG. 1, and the memory controller 6220 may correspond to the controller 130 in the memory system 110 illustrated in FIG. 1.

The memory controller 6220 may control a read, write or erase operation on the memory device 6230 in response to a request of a host 6210, and the memory controller 6220 may include one or more central processing units (CPUs) 6221, a buffer memory such as a random-access memory (RAM) 6222, an error correction code (KC) circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the memory device 6230 to operate at high speed.

The ECC circuit 6223 may correspond to the ECC component 138 of the controller 130 illustrated in FIG. 1. As described with reference to FIG. 1, the ECC circuit 6223 may generate an error correction code (KC) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. The ECC circuit 6223 may correct an error using the parity bit. For example, as described with reference to FIG. 1, the ECC circuit 6223 may correct an error using Low Density Parity Check (LDPC) code, Bose-Chaudhri-Hocquenghem (BCH) code, turbo code, Reed-Solomon code, convolution code, Recursive Systematic Code (RSC) or coded modulation such as Trellis-Coded Modulation (TCM) or Block coded modulation (BCM).

The memory controller 6220 may transmit and receive data to and from the host 6210 through the host interface 6224, and transmit and receive data to and from the memory device 6230 through the NVM interface 6225. The host interface 6224 may be connected to the host 6210 through a parallel advanced technology attachment (DATA) bus, serial advanced technology attachment (SATA) bus, small computer system interface (SCSI), universal serial bus (USB), peripheral component interconnect-express (PCIe) or NAND interface. The memory controller 6220 may have a wireless communication function with a mobile communication protocol such as wireless fidelity (WiFi) or Long-Term Evolution (LTE). The memory controller 6220 may be connected to an external device, for example, the host 6210 or another external device, and then transmit and receive data to and from the external device. In particular, as the memory controller 6220 is configured to communicate with the external device through one or more of various communication protocols, the memory system and the data processing system in accordance with an embodiment may be applied to wired and/or wireless electronic devices or particularly a mobile electronic device.

Figure 14:
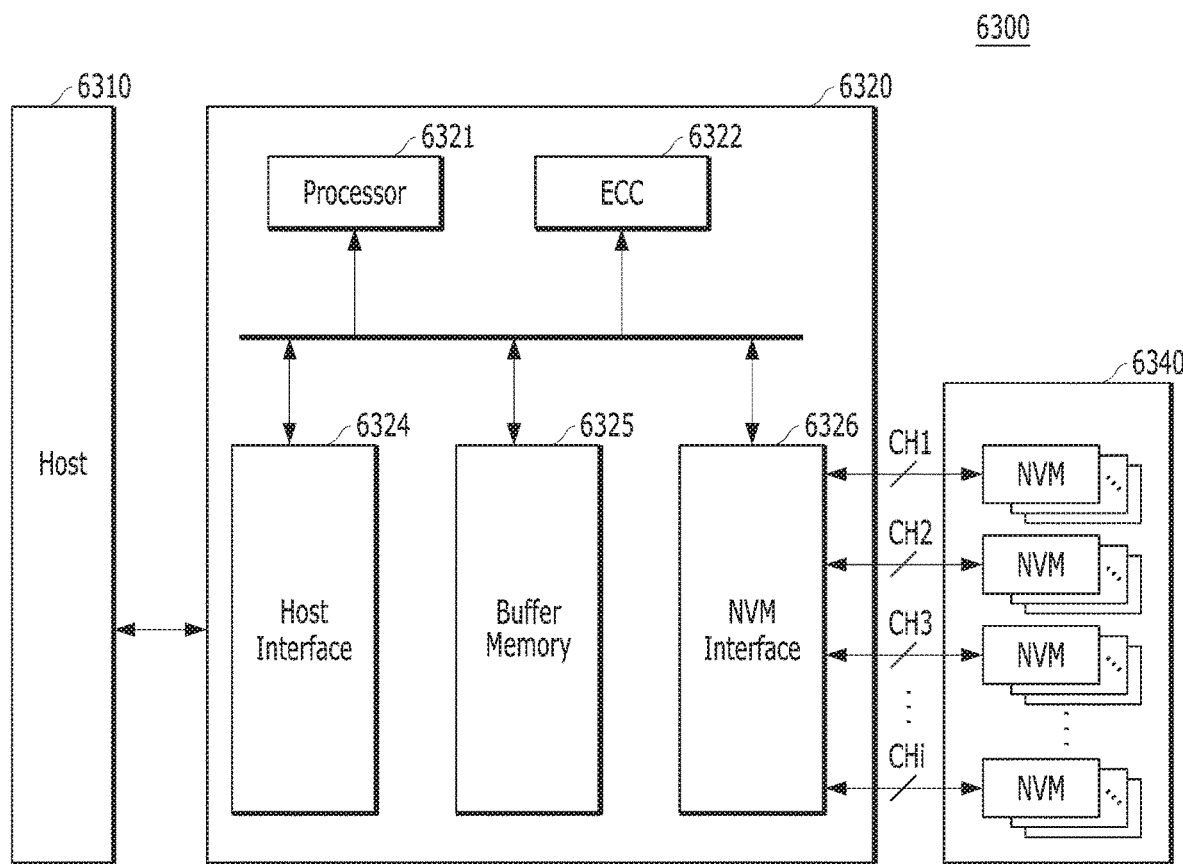

FIG. 14 is a diagram schematically illustrating another example of the data processing system including the memory system in accordance with an embodiment. FIG. 14 schematically illustrates a solid-state drive (SSD) 6300 to which the memory system may be applied.

Referring to FIG. 14, the SSD 6300 may include a controller 6320 and a memory device 6340 including a plurality of nonvolatile memories (NVMs). The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, an error correction code (ECC) circuit 6322, a host interface 6324, a buffer memory 6325 and a memory interface, for example, a nonvolatile memory interface 6326.

The buffer memory 6325 may temporarily store data provided from the host 6310 or data provided from a plurality of flash memories as a nonvolatile memory (NVM) included in the memory device 6340, or temporarily store meta data of the plurality of flash memories NVM, for example, map data including a mapping table. The buffer memory 6325 may be embodied by volatile memories such as a dynamic random-access memory (DRAM), a synchronous DRAM (SDRAM), a double data rate (DDR) SDRAM, a low power DDR (LPDDR) SDRAM and a graphics RAM (GRAM) or nonvolatile memories such as a ferroelectric RAM (FRAM), a resistive RAM (RRAM or ReRAM), a spin-transfer torque magnetic RAM (STT-MRAM) and a phase-change RAM (PRAM). For convenience of description, FIG. 11 illustrates that the buffer memory 6325 exists in the controller 6320. However, the buffer memory 6325 may exist in an external of the controller 6320.

The ECC circuit 6322 may calculate an error correction code (ECC) value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, a Redundant Array of Independent Disks (RAID) system. At this time, the RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 15:
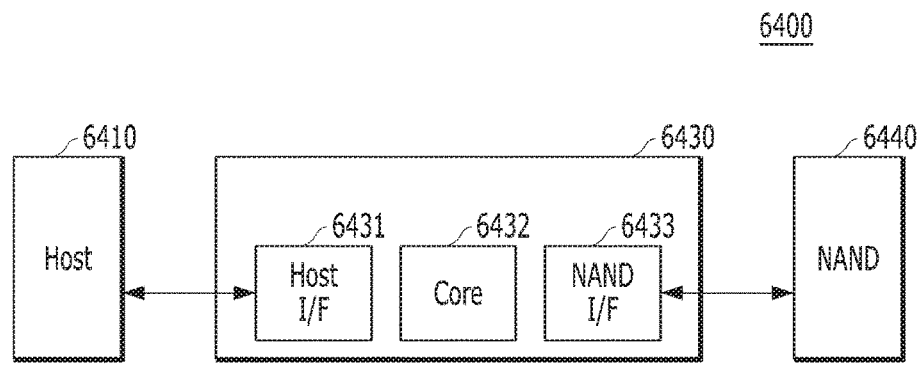

FIG. 15 is a diagram schematically illustrating another example of the data processing system including the memory system in accordance with an embodiment. FIG. 15 schematically illustrates an embedded Multi Media Card (eMMC) 6400 to which the memory system may be applied.

Referring to FIG. 15, the eMMC 6400 may include a controller 6430 and a memory device 6440 embodied by one or more NAND flash memories. The controller 6430 may correspond to the controller 130 in the memory system 110 of FIG. 1, and the memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface (I/F) 6431 and a memory interface, for example, a NAND interface (I/F) 6433.

The core 6432 may control overall operations of the eMMC 6400, the host interface 6431 may provide an interface function between the controller 6430 and the host 6410. The NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, Ultra High Speed (UHS)-I and UHS-II interface.

FIGS. 16 to 19 are diagrams schematically illustrating other examples of the data processing system including the memory system in accordance with one or more embodiments. FIGS. 16 to 19 schematically illustrate UFS (Universal Flash Storage) systems to which the memory system may be applied.

Referring to FIGS. 16 to 19, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired and/or wireless electronic devices or particularly mobile electronic devices, the UFS devices 6520, 6620, 6720 and 6820 may serve as embedded UFS devices. The UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired and/or wireless electronic devices or particularly mobile electronic devices through UFS protocols. The UFS devices 6520, 6620, 6720 and 6820 and the UFS cards 6530, 6630, 6730 and 6830 may be embodied by the memory system 110 illustrated in FIG. 1. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 13 to 15, and the UFS cards 6530, 6630, 6730 and 6830 may be embodied in the form of the memory card system 6100 described with reference to FIG. 12.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI Unified Protocol (UniPro) in Mobile Industry Processor Interface (MIPI). Furthermore, the UFS devices 6520, 6620, 6720 and 6820 and the UFS cards 6530, 6630, 6730 and 6830 may communicate with each other through various protocols other than the UFS protocol, for example, universal storage bus (USB) Flash Drives (UFDs), a multi-media card (MMC), a secure digital (SD), mini-SD, and micro-SD.

Figure 16:
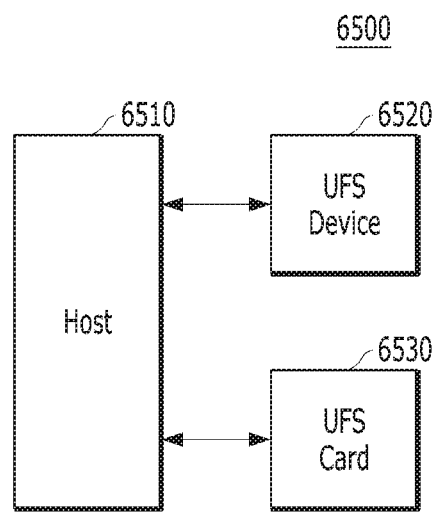

In the UFS system 6500 illustrated in FIG. 16, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. At this time, the UFS device 6520 and the UFS card 6530 may communicate with each other through link layer switching at the UniPro of the host 6510. In an embodiment, the configuration in which one UFS device 6520 and one UFS card 6530 are connected to the host 6510 has been exemplified for convenience of description. However, a plurality of UFS devices and UFS cards may be connected in parallel or in the form of a star to the host 6510, and a plurality of UFS cards may be connected in parallel or in the form of a star to the UFS device 6520 or connected in series or in the form of a chain to the UFS device 6520.

Figure 17:
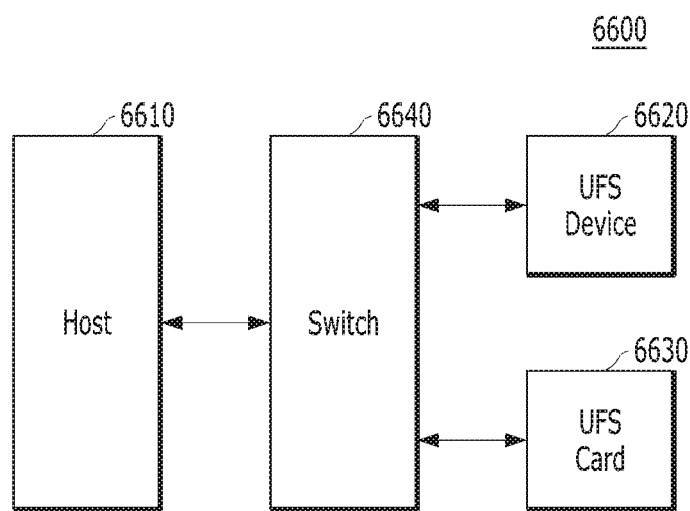

In the UFS system 6600 illustrated in FIG. 17, each of the host 6610, the UFS device 6620 and the UFS card 6630 may include UniPro. The host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In an embodiment, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 18:
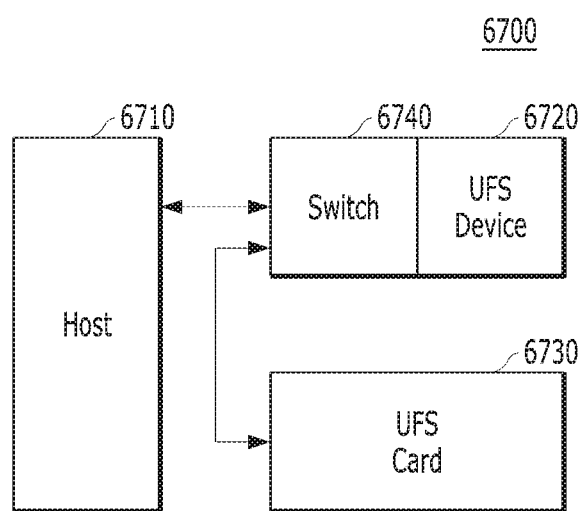

In the UFS system 6700 illustrated in FIG. 18, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. At this time, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In an embodiment, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 19:
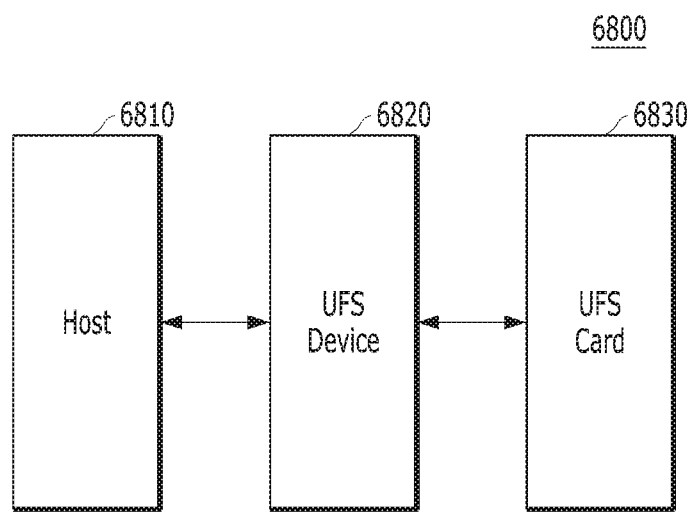

In the UFS system 6800 illustrated in FIG. 19, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target Identifier (ID) switching operation. At this time, the host 6810 and the UFS card 6830 may communicate with each other through target ID switching between the M-PHY and UniPro modules of the UFS device 6820. In an embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 20:
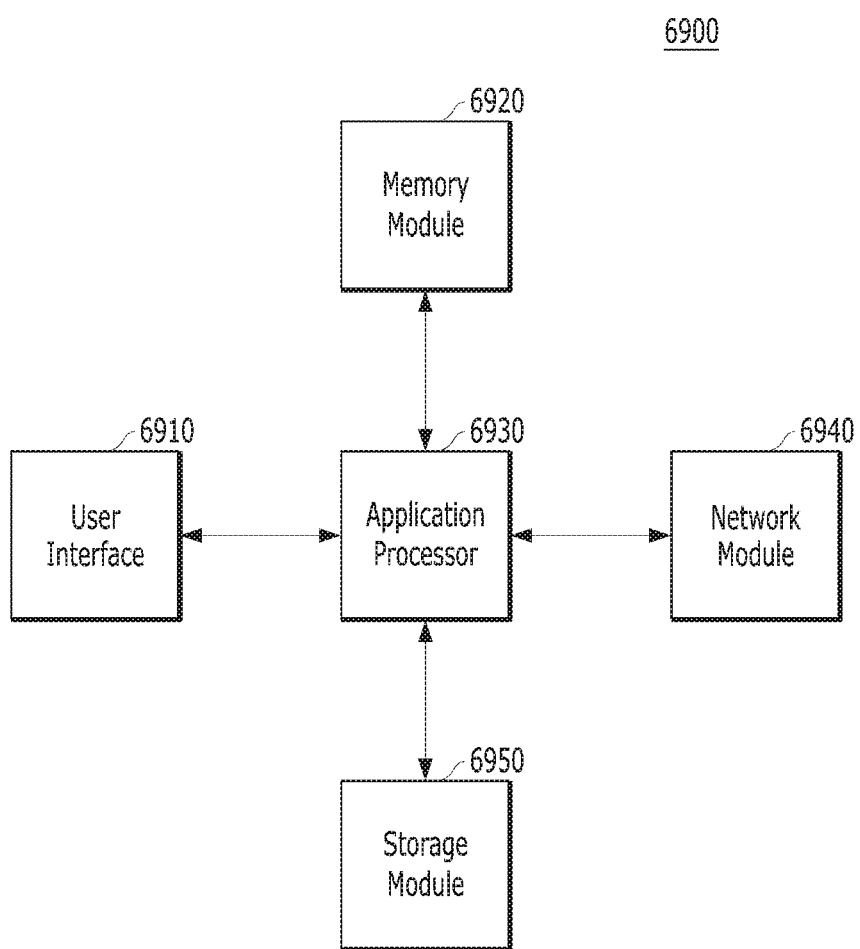

FIG. 20 is a diagram schematically illustrating another example of the data processing system including the memory system in accordance with an embodiment. FIG. 20 is a diagram schematically illustrating a user system 6900 to which the memory system may be applied.

Referring to FIG. 20, the user system 6900 may include a user interface 6910, a memory module 6920, an application processor 6930, a network module 6940, and a storage module 6950.

More specifically, the application processor 6930 may drive components included in the user system 6900, for example, an operating system (OS), and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile random-access memory (RAM) such as a dynamic RAM (DRAM), a synchronous DRAM (SDRAM), a double data rate (DDR) SDRAM, DDR2 SDRAM, DDR3 SDRAM, a low power DDR (LPDDR) SDARM, LPDDR3 SDRAM or LPDDR3 SDRAM or a nonvolatile RAM such as a phase-change RAM (PRAM), a resistive RAM (ReRAM), a magneto-resistive RAM (MRAM) or a ferroelectric RAM (FRAM). For example, the application processor 6930 and the memory module 6920 may be packaged and mounted, based on Package on Package (PoP).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, eMMC and UFS as described above with reference to FIGS. 14 to 19.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control overall operations of the mobile electronic device, and the network module 6940 may serve as a communication module for controlling wired and/or wireless communication with an external device. The user interface 6910 may display data processed by the processor 6930 on a display and touch module of the mobile electronic device, or support a function of receiving data from the touch panel.

While the present invention has been described with respect to specific embodiments, it will be apparent to those skilled in the art in light of this disclosure that various changes and modifications may be made without departing from the spirit and scope of the invention as defined in the following claims.

What is claimed is:

1. A memory system comprising:
    a memory device; and
    a non-erase block management device suitable for determining, when an erase operation is performed on a first memory block included in the memory device, whether to remove holes trapped in a channel of transistors included in a second memory block by performing a dummy read operation on a second word line of a second memory block, according to a location of a first word line, which is a target word line for a read operation on the second memory block.

2. The memory system of claim 1, wherein the non-erase block management device includes:
    a flag table including an erase flag and a non-erase flag for each of the first memory block and the second memory block; and
    a stress prevention read controller suitable for controlling the memory device to perform the read operation on the second word line based on the flag table.

3. The memory system of claim 2, wherein the non-erase block management device changes, when an erase operation is performed on the first memory block, the erase flag corresponding to the first memory block from a value of logic low to a value of logic high and the non-erase flag corresponding to the second memory block from a value of logic low to a value of logic high.

4. The memory system of claim 3, wherein the first word line includes one between a bottom word line region at a bottom of the second memory block and a non-bottom word line region other than the bottom word line region.

5. The memory system of claim 4, wherein the non-erase block management device controls, when a read operation is performed on the non-bottom word line region, the memory device to perform a normal read operation on the non-bottom word line region.

6. The memory system of claim 5, wherein the non-erase block management device controls, when a read operation is performed on the bottom word line region, the memory device to perform a stress prevention read operation of first removing the holes and then performing a read operation on the bottom word line region.

7. The memory system of claim 6, wherein the second word line includes one between a dummy word line and a top word line.

8. The memory system of claim 7, wherein the non-erase block management device changes, when one between a normal read operation and the stress prevention read operation is performed, the non-erase flag corresponding to the second memory block from a value of logic high to a value of low logic.

9. The memory system of claim 1,
    wherein the second memory block includes a plurality of blocks, and
    wherein the non-erase block management device includes the flag table including the erase flag and the non-erase flag for each of the plurality of blocks.

10. An operating method of a memory system, the method comprising:
    performing an erase operation on a first memory block included in a memory device;
    determining, through a non-erase block management device, whether to remove holes trapped in a channel of transistors included in a second memory block by performing a dummy read operation on a second word line of a second memory block, which is a memory block other than the first memory block in the memory device, according to a location of a first word line, which is a target word line for a read operation on the second memory block; and
    performing a read operation on the first word line of the second memory block.

11. The method of claim 10, wherein the performing of the dummy read operation on the second word line of the second memory block comprises:
    generating a flag table including an erase flag and a non-erase flag for each of the first memory block and the second memory block; and
    controlling the memory device to perform the read operation on the second word line based on the flag table.

12. The method of claim 11, wherein the performing of the dummy read operation on the second word line of the second memory block includes changing, when an erase operation is performed on the first memory block, the erase flag corresponding to the first memory block from a value of logic low to a value of logic high and the non-erase flag corresponding to the second memory block from a value of logic low to a value of logic high.

13. The method of claim 12, wherein the first word line includes one between a bottom word line region at a bottom of the second memory block and a non-bottom word line region other than the bottom word line region.

14. The method of claim 13, wherein the performing of the dummy read operation on the second word line of the second memory block further includes controlling, when a read operation is performed on the non-bottom word line region, the memory device to perform a normal read operation on the non-bottom word line region.

15. The method of claim 14, wherein the performing of the dummy read operation on the second word line of the second memory block further includes controlling, when a read operation is performed on the bottom word line region, the memory device to perform a stress prevention read operation of first performing a dummy read operation on the second word line and then performing a read operation on the bottom word line region.

16. The method of claim 15, wherein the second word line includes one between a dummy word line and a top word line.

17. The method of claim 16, wherein the performing of the dummy read operation on the second word line of the second memory block further includes changing, when one between a normal read operation and the stress prevention read operation is performed, the non-erase flag corresponding to the second memory block from a value of logic high to a value of low logic.

18. The method of claim 10,
    wherein the second memory block includes a plurality of blocks, and wherein the flag table includes the erase flag and the non-erase flag for each of the plurality of blocks.

19. A memory system comprising:

a memory device including a first memory block and a second memory block other than the first memory block; and a controller suitable for:

performing an erase operation on the first memory block;

selectively eliminating holes trapped in a channel of transistors included in a second memory block by performing a dummy read operation on a second word line of the second memory block based a location of a first word line as a target word line for a read operation on the second memory block; and performing a substantial read operation on the first word line of the second memory block.

20. The memory system of claim 19, wherein the controller performs the dummy read operation on the second word line of the second memory block, when it is determined that the first word line belongs to a bottom word line region at a bottom of the second memory block.

\* \* \* \* \*